US006909324B2

(12) United States Patent
Wallis et al.

(10) Patent No.: US 6,909,324 B2
(45) Date of Patent: Jun. 21, 2005

(54) HIGH-EFFICIENCY SOLID STATE POWER AMPLIFIER

(75) Inventors: Robert E. Wallis, Ellicott City, MD (US); Sheng Cheng, Laytonsville, MD (US)

(73) Assignee: The Johns Hopkins University, Baltimore, MD (US)

( * ) Notice: Subject to any disclaimer, the term of this patent is extended or adjusted under 35 U.S.C. 154(b) by 112 days.

(21) Appl. No.: 10/433,284

(22) PCT Filed: Dec. 12, 2001

(86) PCT No.: PCT/US01/47831

§ 371 (c)(1),
(2), (4) Date: Jun. 2, 2003

(87) PCT Pub. No.: WO02/052723

PCT Pub. Date: Jul. 4, 2002

(65) Prior Publication Data

US 2004/0027203 A1 Feb. 12, 2004

Related U.S. Application Data

(60) Provisional application No. 60/257,563, filed on Dec. 22, 2000.

(51) Int. Cl.[7] .................................................. H03F 3/68
(52) U.S. Cl. .................................. 330/124 R; 330/295
(58) Field of Search ........................... 330/124 R, 295, 330/307, 150, 310, 311

(56) References Cited

U.S. PATENT DOCUMENTS

| 5,008,633 | A | | 4/1991 | Hom |
| 5,206,604 | A | * | 4/1993 | Vaninetti ................. 330/124 R |
| 5,561,397 | A | | 10/1996 | Kumar et al. |
| 5,793,253 | A | * | 8/1998 | Kumar et al. ........... 330/124 R |
| 6,133,790 | A | | 10/2000 | Zhou |
| 6,297,696 | B1 | * | 10/2001 | Abdollahian et al. ... 330/124 R |
| 6,359,504 | B1 | * | 3/2002 | Cozzarelli ..................... 330/51 |

FOREIGN PATENT DOCUMENTS

EP  1 058 380   12/2000

OTHER PUBLICATIONS

Advances in Deep Space Telecommunications Technology at the Applied Physics Laboratory, Fourth IAA Intl. Conf. on Low–Cost Planetary Missions, Mar. 1, 2000, held at APL May 2–5, 2000, by Bokulic et al.

PCT International Search Report, PCT/US 01/47831, dated Dec. 21, 2001.

* cited by examiner

Primary Examiner—Henry Choe
(74) Attorney, Agent, or Firm—Albert J. Fasulo, II (57) ABSTRACT

A high-efficiency solid state power amplifier (SSPA) for specific use in a spacecraft is provided. The SSPA has a mass of less than 850 g and includes two different X-band power amplifier sections, i.e., a lumped power amplifier with a single 11-W output and a distributed power amplifier with eight 2.75-W outputs. These two amplifier sections provide output power that is scalable from 11 to 15 watts without major design changes. Five different hybrid microcircuits, including high-efficiency Heterostructure Field Effect Transistor (HFET) amplifiers and Monolithic Microwave Integrated Circuit (MMIC) phase shifters have been developed for use within the SSPA. A highly efficient packaging approach enables the integration of a large number of hybrid circuits into the SSPA.

28 Claims, 3 Drawing Sheets

HIGH-EFFICIENCY SOLID STATE POWER AMPLIFIER

CROSS-REFERENCE TO RELATED APPLICATIONS

This application claims the benefit of U.S. provisional application No. 60/257,563, filed on Dec. 22, 2000, which is hereby incorporated by reference in its entirety.

STATEMENT OF GOVERNMENTAL INTEREST

This invention was made with United States Government support under Contract No. NAS5-97271 awarded by NASA. The Government has certain rights in the invention.

BACKGROUND OF THE INVENTION

1. Field of the Invention

The present invention relates to a high-efficiency solid state power amplifier (SSPA). The SSPA has a mass of less than 850 g and includes two different X-band power amplifier sections, i.e., a lumped power amplifier with a single 11-W output and a distributed power amplifier with eight 2.75-W outputs. These two amplifier sections provide output power that is scalable from 11 to 15 watts without major design changes.

2. Description of the Related Art

The Mercury Surface, Space Environment, Geochemistry, and Ranging (MESSENGER) NASA discovery mission is being designed to orbit and study the planet Mercury. After its scheduled launching in March 2004, the MESSENGER spacecraft will perform flybys of Venus and Mercury before going into orbit around the planet in April 2009.

The inner planet trajectory of the MESSENGER mission results in the need for a high-gain downlink to Earth in all directions around the spacecraft. In addition, the extreme thermal environment causes distortions to the antenna pattern of the traditional parabolic antennas. Phased-array antennas have had limited application in the deep-space community to date but one-dimensional electronically scanned antennas eliminate the use of deployed components and gimbal dish antennas and offer benefits of high-gain, low mass, and graceful degradation. Accordingly, two lightweight, phased-array antenna systems have been developed for use in the MESSENGER spacecraft for the high-gain downlink.

A need therefore exists for a high-efficiency power amplifier for use in powering a respective one of the two lightweight, phased-array antenna systems of the MESSENGER spacecraft.

SUMMARY OF THE INVENTION

The present invention provides a high-efficiency solid state power amplifier (SSPA). Two SSPAs may be used to power a respective phased-array antenna system for use, e.g., in the MESSENGER spacecraft. Each SSPA has a mass of less than 850 g and includes two different X-band power amplifier sections, i.e., a lumped power amplifier with a single 11-W output and a distributed power amplifier with eight 2.75-W outputs. These two amplifier sections provide output power that is scalable from 11 to 15 watts without major design changes.

Five different hybrid microcircuits, including high-efficiency Heterostructure Field Effect Transistor (HFET) amplifiers and Monolithic Microwave Integrated Circuit (MMIC) phase shifters have been developed for use within the SSPAs. A highly efficient packaging approach enables the integration of a large number of hybrid circuits into the SSPA. It is provided that the SSPAs, the hybrids and the hermetic package are generic and are suitable for a wide range of space applications beyond the MESSENGER program.

DESCRIPTION OF THE PREFERRED EMBODIMENTS

With reference to FIGS. 1–5, a detailed description will now be provided as to the design of the solid state power amplifier (SSPA); the design of the SSPA package; the design of the SSPA line-up; the design of a four-way divider/combiner; and the design of a digital controller.

A. SSPA Design

Figure 1:
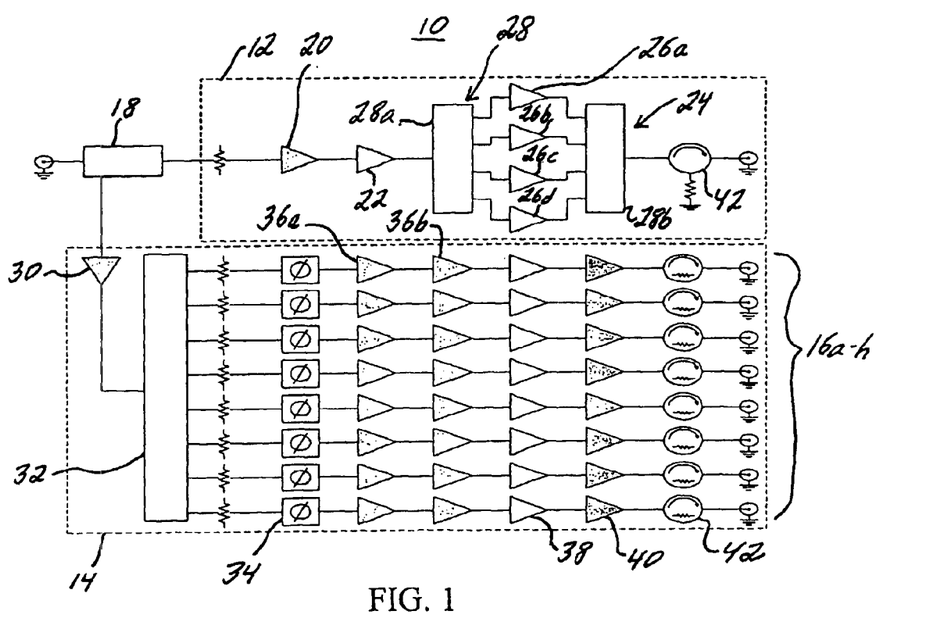
FIG. 1 is a schematic, block diagram of the SSPA according to the present invention.

With reference to FIG. 1, there is shown an SSPA according to the present invention which is designated by reference numeral 10. The SSPA 10 includes two different X-band power amplifier sections, i.e., a lumped power amplifier 12 capable of outputting approximately 11 Watts of output power and a distributed power amplifier 14 having eight distributed amplifier chains 16a–h each capable of outputting approximately 2.75 Watts of output power. Only one of these two sections 12, 14 is powered at any given time, depending on the antenna selected (see FIG. 5). In addition, section 14 has two subsections each having four distributed amplifiers chains. Each subsection is capable of outputting a total of 11 Watts of output power. The purpose of the two subsections is to provide redundancy and enhance the overall reliability. A digital controller receives beam-steering commands from a spacecraft main processor and provides the phase-shifter settings for the eight distributed power amplifier chains 16a–h. This unit also transfers telemetry data from the SSPA 10 to the spacecraft. A dedicated external power conditioning unit (PCU) supplies approximately 42 W of secondary DC power to the SSPA 10. The SSPA 10 is preferably mounted inside the spacecraft where the base plate temperatures are expected to be between −30 and +65 degrees Celsius.

A parallel line coupler 18 divides the input signal for the lumped and distributed amplifier sections 12, 14. The lumped amplifier section 12 includes a Gallium Arsenide Monolithic Microwave Integrated Circuit (GaAs MMIC) amplifier 20, a 2.4-mm Heterostructure Field Effect Transistors (HFET) driver amplifier 22 (FIG. 4), and a power amplifier stage 24. Four MMIC power amplifiers 26a–d, arranged in balanced configuration using a four-way divider/combiner 28 having a four-way divider 28a and a four-way combiner 28b, form the power amplifier stage 24 of the lumped amplifier section 12.

The same MMIC amplifiers and similar HFET driver amplifier are used in the distributed amplifier section 14. The distributed amplifier section 14 starts with a MMIC amplifier 30 followed by an eight-way divider 32. At each output of the divider 32 is an MMIC phase shifter 34, two MMIC amplifiers 36*a–b*, a 1.2-mm HFET driver amplifier 38, and a MMIC power amplifier 40. Isolators 42 are used at all outputs of the SSPA 10 to protect the power amplifier stages 12, 14 during testing as well as to ensure stable power amplifier performance.

Both the lumped and the distributed amplifier sections 12, 14 are expected to exhibit greater than 28% DC to RF efficiency while working at the specified output power level. To meet these requirements over the temperature range that will be encountered, the SSPA 10 employs two temperature compensation schemes. The first scheme adjusts the DC supply voltage to the power amplifier stage 12 or 14 as the temperature varies to compensate for the output power-capacity change of the power device. The other scheme uses a temperature-compensating attenuator to provide constant gain. Extensive temperature testing of the lumped and distributed amplifier sections 12, 14 during the brassboard testing phase was performed to collect data for the temperature-compensation design. (See Section II.) The nominal SSPA supply voltage is selectable to provide easy adjustment of the SSPA output power within the range of 11 to 15 W.

B. Power Amplifier Packaging Design

The SSPA packaging design leverages proven high-reliability microwave integrated circuit (MIC) and hybrid construction techniques to optimize mass, producibility and thermal path for the active devices. Maintaining a good thermal path allows minimum device operating temperature, which enhances performance and reliability. The MMIC and HFET solid state amplifiers are preferably procured in die form and installed in hybrid microcircuits. The use of die form parts, as opposed to commercially available packaged parts, allows a wider range of parts to be considered, and allows device selection for optimum SSPA efficiency.

As the packaging design was developed, careful consideration was given to the manufacturing and screening aspects of the circuits within the SSPA 10. Screening of the circuits consists of a sequence of electrical and environmental tests designed to eliminate devices which do not meet performance requirements. The traditional approach of using packaged semiconductors places the burden and risk of screening on the device supplier. The use of devices in die form requires one to consider the screening of the devices as an integral part of the microwave circuit design. Two fundamentally different approaches referred to as multi-chip and single-chip hybrids were considered in designing the SSPA 10 according to the present invention. Descriptions of these approaches and the associated tradeoffs follow.

The multi-chip module approach consists of one large hybrid assembly, which includes the lumped and distributed SSPA functions. A laser-welded hermetic aluminum chassis contains chip-and-wire-based microwave circuits. This approach results in the highest level of integration and results in the least mass and volume. In addition, the number of screened hybrids and test fixtures are minimized. However, with the higher level of integration comes increased non-recurring engineering (NRE) for the hermetic package and increased touch labor learning with a more complex hybrid. Since MESSENGER requires only two SSPAs (see FIG. 5), the reduced screening and recurring costs of this approach were outweighed by the increased development costs. A larger production volume is required for this approach to be economically attractive. Finally, placing the risk of screening failures at the end of the SSPA assembly sequence is highly undesirable in a schedule-critical program.

Figure 2:
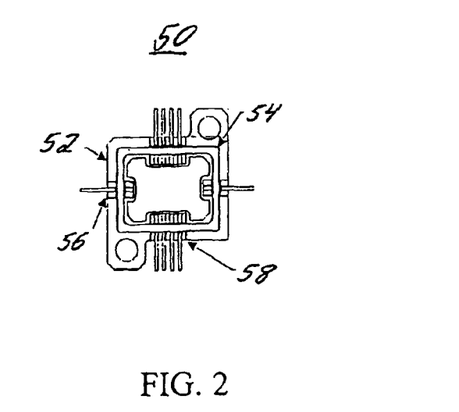
FIG. 2 is a schematic diagram of a microwave hybrid package of the SSPA according to the present invention.

The single-chip hybrid approach consists of a single function hybrid circuit containing only one active device. This approach requires a total of 47 hybrid circuits per SSPA 10. FIG. 2 shows a versatile, hermetic hybrid package 50 according to the present invention that accommodates each of the five circuit designs and enables integration of the hybrid circuits into a high-density layout. The hybrid package 50 includes a base 52, a ring frame 54, a feed-through and RF lead 56, and feed-through and DC leads 58. The base 52 is preferably a tungsten-copper base and the ring frame 54 is preferably made from kovar. The feed-through and leads 56, 58 are preferably made from ceramic and kovar. The preferred dimensions of the hybrid package 50 are 11.7 by 14.7 mm.

By designing a single common hermetic hybrid package, NRE costs for the package and associated test fixtures are minimized. Since each hybrid circuit contains very few components, assembly and screening yields are high. Any defects are discovered by screening after the minimum in elapsed schedule and value-added labor. Finally, the SSPA package and single-chip hybrid circuits are generic and more likely to be reused in a wide range of space applications beyond the MESSENGER program than the custom multi-chip hybrid described previously. The single-chip hybrid is the chosen approach.

As part of the tradeoff analysis between the multi-chip and single-chip hybrid approaches, a higher level packaging concept was needed for the single-chip hybrid approach. The mass estimate for the preferred SSPA 10 is 850 g and the dimensions of its layout are 314 by 161 mm. The mass compares favorably with the mass of existing X-band multi-chip hybrid SSPAs, which suggests that there need not be a mass penalty for the single-chip hybrid approach.

C. Power Amplifier Line-Up Design

The SSPA design achieves high efficiency and small size without custom MMIC devices. The use of commercially available devices with established reliability allowed rapid development and verification of the hybrid circuit designs. Available packaged devices would not simultaneously meet the efficiency and output power requirements of the SSPA 10. MMIC and discrete die devices provide excellent performance, but the packaging, fabrication, and screening issues are often a deterrent to the SSPA manufacturer. These issues are minimized by using a small number of device types in the line-up and by re-using the devices throughout the line-up.

Figures 3A, 3B:
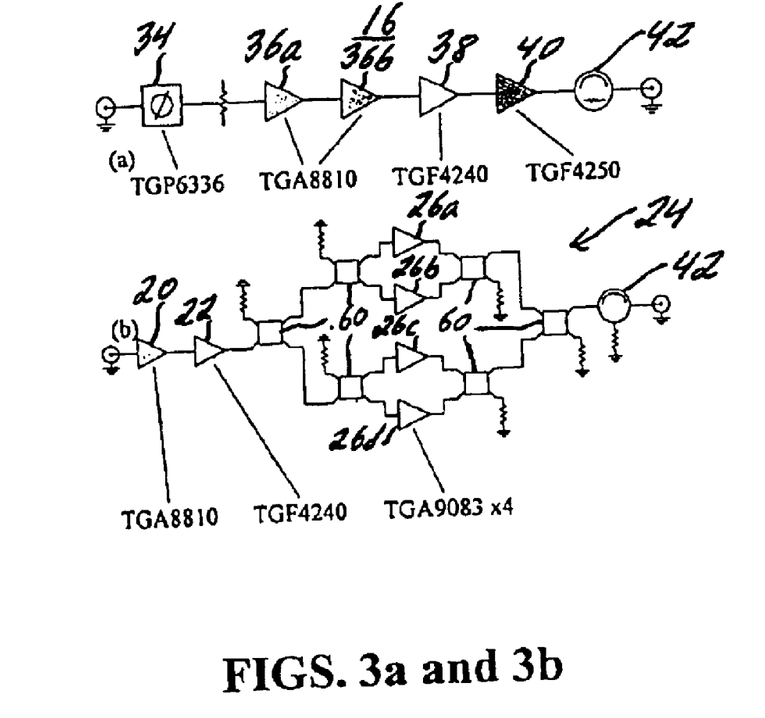
FIG. 3a is a schematic diagram of one of the distributed amplifier chains of the SSPA according to the present invention.
FIG. 3b is a schematic diagram of the lumped amplifier section of the SSPA according to the present invention.

The electrical design of the SSPA 10 began by selecting suitable devices for the output stages, then working toward the inputs. FIG. 3*a* shows the line up of one of the eight amplifier chains 16*a–h* in the distributed amplifier section 14. The inventive driver stage 38 is a discrete MIC amplifier designed using the TGF4230 1.2-mm HFET. The output stage 40 uses the TGA9083 power amplifier MMIC.

Device 38 and 40 are operated at +6.5 V in order to reduce the total DC power consumption while maintaining high efficiency. Load-pull measurements were utilized when designing this output stage, as well as its driver. The 1.2-mm driver 38 has sufficient output power capacity when driving the final or output stage 40, making the amplifier 10 less sensitive to gain variations versus temperature as well as life and normal device variations across the wafer lot.

The 1.2-mm HFET driver is operated at +6.5 V in order to maintain high efficiency at the required output power.

Driving the 1.2-mm HFET amplifier are two cascaded TGA8810 MMIC amplifiers 36a, 36b. These amplifiers 36a, 36b have 17 dB of gain and 17 dBm of output power. The TGP6336 MMIC 34 is a five-bit phase shifter with 9-dB typical insertion loss. Only the first four most-significant bits of the phase shifter 34 are necessary to provide less than 0.1 dB quantization loss while steering the phased-array antenna.

These phase shifters 34 require a single-ended control signal for each phase shift bit. This is preferred over a complementary control signal interface, which would have required either more control lines into the hybrid package or more electronics within the package. A fixed attenuator, integrated into the phase-shifter hybrid package, helps to improve the output return loss of the phase shifter. A TGA8810 amplifier 30, shown in the SSPA block diagram (FIG. 1), is used to drive the eight-way divider 32 to form the complete distributed amplifier section 14. Expected performance of the distributed amplifier subsection 14 is 11 W RF power, 39.9 W DC power, and 28% efficiency.

FIG. 3b is the line-up of the lumped amplifier section 12. Each output amplifier 26 is a TGA9083 MMIC amplifier capable of 8 W of output power and 35% power-added efficiency at +9 V. The initial line-up used only two of these devices in parallel to provide greater than 10 W combined output power. However, a desire to increase the output power and decrease the channel temperatures of these devices led to the current four-way combined configuration. These four parallel devices 26 operate from a +7-V supply. Under this operating condition, the MMIC 26 is capable of 5 W of output power and 40% efficiency. A TGA8810 MMIC amplifier 20 followed by a TGA4240 amplifier 22 drive the output stage 24. Expected performance of the lumped amplifier section 12 is 11 W total RF power, 39.9 W DC power and 28% efficiency.

D. HFET Amplifier Design

The most challenging part in the electrical design of the SSPA 10 is achieving high efficiency, power, and gain in the two HFET amplifier stages 38, 22. A small signal model of the HFETs 38, 22 aided in the input-matching circuit design. Large signal models were unavailable, and simulation of the amplifier in large signal operation was not possible. Instead, input-matching and output-matching circuits were designed using separate simulations. Initial circuits were assembled and tested, under large signal conditions, in a load-pull system.

The test results were used to adjust the circuit model, and new matching circuits were simulated. Final circuit designs were created that met the power, efficiency, and gain requirements. This procedure was applied to both 2.4-mm and 1.2-mm HFET amplifier designs.

The low gate impedance of the HFET amplifiers 38, 22 causes some difficulty in the design process. At 8.4 GHz the gate impedance is outside the load-pull tuner's range. Designing a microstrip transformer to match the input impedance was challenging because of the uncertainty in the gate bond-wire inductance.

To reduce the number of the uncertainties in the design process, the initial amplifier circuits were comprised of input-matching and output-matching transformers and bond wires of a nominal length connected to the HFETs 38, 22. The transistors were biased through external bias tees initially. Coarse adjustment of the circuits consisted of iterating the bond wire lengths. Fine-tuning was accomplished by removing the metalization of the microstrip transformer with a diamond scribe and by moving the parallel gate and/or drain bond wires closer together or farther apart.

After the successful tuning of the transformers and bond wires, other essential parts of the amplifier 38, 22 were incorporated into a new design iteration. These included the RF chokes for bias injection, blocking capacitors, and parallel line coupler 101. The coupler 101 is intended for use as a diagnostic aid at the SSPA assembly level. For example, to aid in diagnosing problems with multistage amplifiers. While the addition of these circuit elements de-tuned the amplifier slightly, the above tuning procedure was repeated to re-align the performance of the amplifier 38, 22.

Figure 4:
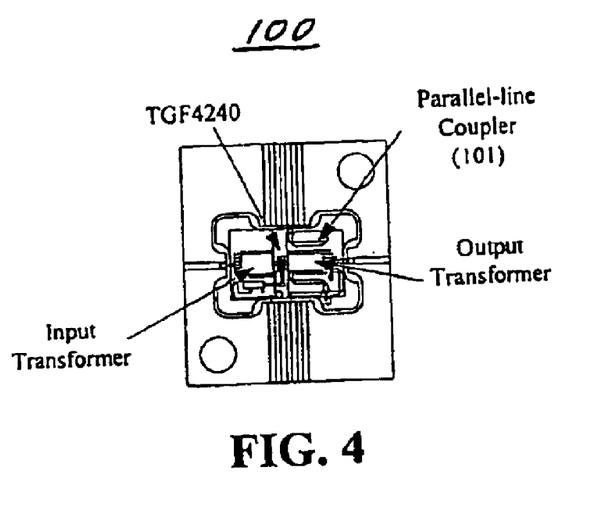
FIG. 4 is a schematic diagram of a hybrid layout of a 2.4 mm amplifier.

FIG. 4 shows the hybrid layout of the 2.4-mm amplifier designated generally by reference numeral 100. The differences between this and the 1.2-mm amplifier are the transformer dimensions and the resistor values in the bias networks. The drain bias circuit shown in FIG. 4 presents a very high impedance to the amplifier circuit at the operating 8.4 GHz frequency. A resistor-capacitor circuit to ground improves the low-frequency stability. The gate-bias circuit is designed to present a 60 Ω load at DC to the gate and a slightly higher shunt resistance at 4.1 GHz to prevent sub-harmonic oscillations. All RF bond wires are nominally 27 mils long.

E. Four-Way Divider/Combiner

With reference to FIG. 3b, the design of the four-way combiner/divider circuit 28 uses branch-line hybrid couplers 60 arranged asymmetrically in a two-level corporate configuration. The branch-line couplers 60 provide excellent impedance match and amplitude balance with low loss in a microstrip medium. The couplers 60 are preferably fabricated on Rogers TMM10 material along with the other microstrip lines of the lumped amplifier section 12. The use of a single board for these lines eliminates the need for tight tolerances and alignment of separate circuit carriers to the adjoining amplifier stages.

F. Digital Controller

The digital controller is comprised of three primary circuits: a 1553 remote terminal hybrid, an ACTEL field programmable gate array (FPGA), and an application-specific integrated circuit known as the Temperature Remote Input & Output (TRIO) chip.

The digital controller receives the array steering information from the spacecraft main processor via a redundant MIL-STD 1553 bus and provides the eight phase shifters 34 with a four-bit control word. The controller also utilizes this bus to transfer telemetry from the SSPA 10 to the command and data handling system. Digital telemetry is provided to echo back the beam steering command. Analog telemetry data are converted to digital using the TRIO chip. For subassembly testing, the phase shifters 34 can be exercised without the digital controller through a separate test connector.

G. Messenger Telecommunication System

Figure 5:
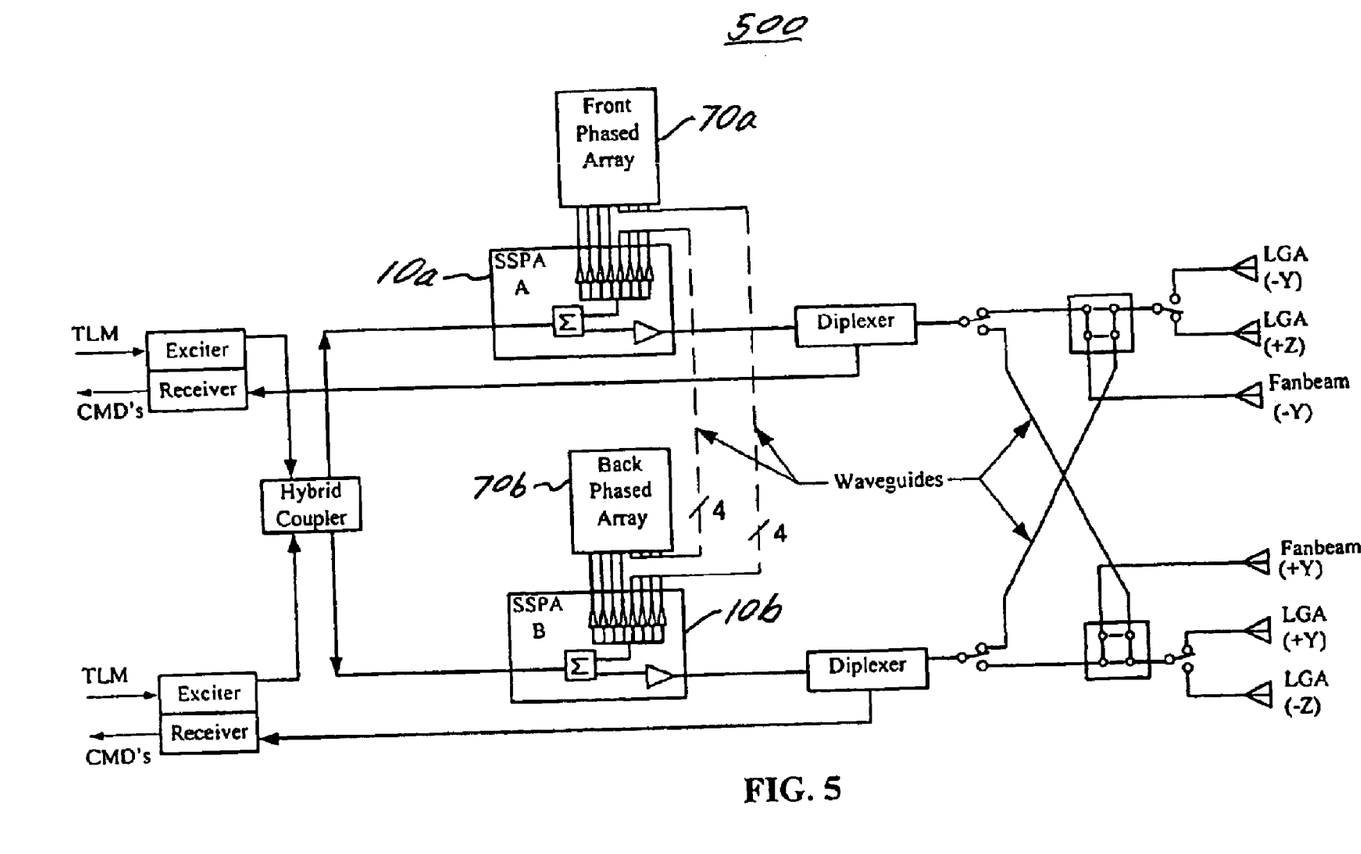
FIG. 5 is a block diagram of the MESSENGER RF telecommunication system having two SSPAs according to the present invention.

FIG. 5 is a block diagram of the MESSENGER RF telecommunication system having two SSPAs 10 and designated generally by reference numeral 500. The MESSENGER telecommunication system is designed to transmit the mission science data, receive spacecraft commands from Earth, and provide high-precision navigation data. As these are spacecraft-critical functions, the architecture for the telecommunication system must be redundant and immune from any credible single-point failure.

Within each SSPA 10a, 10b are the two functional amplifiers 12, 14, i.e., the distributed and lumped power amplifiers. Each distributed power amplifier 14 provides 2.75-W nominal drive level into four of the eight array antenna inputs. The distributed sections of SSPAs 10a, 10b are cross-strapped with the array antennas 70a, 70b to allow transmission through either antenna in the event of a failure of either SSPA. The lumped power amplifier 12 provides an 11-W X-band output to fan beam antennas and low-gain horn antennas. The distributed power amplifier 14 provides a graceful degradation in case of an amplifier element failure. Even if a complete array failure occurs, on-board solid-state recorders can store the science data for later downlink with the other array.

Accordingly, the first electronically scanned phased array for deep space telecommunication is complemented by high-efficiency SSPAS. The highly efficient, 11 to 15-W design has been developed using a modular assembly of hybrid microcircuits. The hybrids and the common hermetic package are suitable for a wide range of applications.

What has been described herein is merely illustrative of the application of the principles of the present invention. Other arrangements and methods may be implemented by those skilled in the art without departing from the scope and spirit of this invention.

What is claimed is:

1. A solid state power amplifier device comprising:
    a first amplifier section having a power amplifier stage connected to at least one solid state amplifier for receiving a first input signal therefrom and for providing output power via an output node;
    a second amplifier section having a plurality of amplifier lines each having a plurality of solid state amplifiers and connected to a divider, wherein a signal inputted within the divider is divided into a plurality of signals and each one of the plurality of signals is fed to a respective one of the plurality of amplifier lines for providing output power from a respective output node of each of the plurality of amplifier lines, wherein the output power provided by each of the plurality of amplifier lines is less than the output power provided by the power amplifier stage; and
    a coupler for receiving an input signal and dividing the same into the first and second input signals,
    wherein the first amplifier section further includes an isolator connected to the power amplifier stage and wherein each of the plurality of amplifier lines further includes an isolator connected in series to the plurality of solid state amplifiers.

2. The solid state power amplifier device according to claim 1, wherein the power amplifier stage comprises:
    a divider for dividing the first input signal into a plurality of signals;
    a plurality of solid state amplifiers connected to the divider of the power amplifier stage for receiving a respective one of the plurality of signals outputted by the divider and outputting a corresponding amplified signal; and
    a combiner connected to each of the plurality of solid state amplifiers of the power amplifier stage for receiving the amplified signals and outputting a combined output signal.

3. The solid state power amplifier device according to claim 2, wherein each of the plurality of solid state amplifiers of the power amplifier stage are Monolithic Microwave Integrated Circuit (MIMIC) amplifiers.

4. The solid state power amplifier device according to claim 1, wherein the second amplifier section further includes a MMIC amplifier connecting the coupler to the divider of the second amplifier section.

5. The solid state power amplifier device according to claim 1, wherein the output power of the first amplifier section is approximately 11 Watts and the output power of each of the plurality of amplifier lines is approximately 2.75 Watts.

6. The solid state power amplifier device according to claim 1, wherein the total power output of the solid state power amplifier device is within the range of 11 to 15 Watts.

7. The solid state power amplifier device according to claim 2, wherein the plurality of solid state amplifiers of the plurality of amplifier lines, the plurality of solid state amplifiers of the power amplifier stage, and the at least one solid state amplifier of the first amplifier section are procured in die form and installed in hybrid microcircuits.

8. The solid state power amplifier device according to claim 2, wherein each of the plurality of solid state amplifiers of the plurality of amplifier lines, each of the plurality of solid state amplifiers of the power amplifier stage, and each of the at least one solid state amplifier of the first amplifier section is packaged in a hermetic package and each package contains only one active device.

9. The solid state power amplifier device according to claim 1, wherein each output node of the second amplifier section is configured for connection to a respective input node of a phased-array antenna.

10. A solid state power amplifier device comprising:
    a first amplifier section having a power amplifier stage connected to at least one solid state amplifier for receiving a first input signal therefrom and for providing output power via an output node;
    a second amplifier section having a plurality of amplifier lines each having a plurality of solid state amplifiers and connected to a divider, wherein a signal inputted within the divider is divided into a plurality of signals and each one of the plurality of signals is fed to a respective one of the plurality of amplifier lines for providing output power from a respective output node of each of the plurality of amplifier lines, wherein the output power provided by each of the plurality of amplifier lines is less than the output power provided by the power amplifier stage; and
    a coupler for receiving an input signal and dividing the same into the first and second input signals,
    wherein the at least one solid state amplifier for receiving the first input signal includes a Gallium Arsenide Monolithic Microwave Integrated Circuit (GaAs MMIC) amplifier and a Heterostructure Field Effect Transistor (HFET) driver amplifier, wherein the GaAs MMIC amplifier and the HFET amplifier are connected in series.

11. A solid state power amplifier device comprising:
    a first amplifier section having a power amplifier state connected to at least one solid state amplifier for receiving a first input signal therefrom and for providing output power via an output node;
    a second amplifier section having a plurality of amplifier lines each having a plurality of solid state amplifiers and connected to a divider, wherein a signal inputted within the divider is divided into a plurality of signals and each one of the plurality of signals is fed to a respective one of the plurality of amplifier lines for providing output power from a respective output node of each of the plurality of amplifier lines, wherein the output power provided by each of the plurality of amplifier lines is less than the output power provided by the power amplifier stage; and
    a coupler for receiving an input signal and dividing the same into the first and second input signals, wherein each of the plurality of power amplifier lines further includes a phase shifter for receiving a respective signal of the plurality of signals outputted by the divider.

12. A solid state power amplifier device comprising:
a first amplifier section having a power amplifier stage connected to at least one solid state amplifier for receiving a first input signal therefrom and for providing output power via an output node;
a second amplifier section having a plurality of amplifier lines each having a plurality of solid state amplifiers and connected to a divider, wherein a signal inputted within the divider is divided into a plurality of signals and each one of the plurality of signals is fed to a respective one of the plurality of amplifier lines for providing output power from a respective output node of each of the plurality of amplifier lines, wherein the output power provided by each of the plurality of amplifier lines is less than the output power provided by the power amplifier stage; and
a coupler for receiving an input signal and dividing the same into the first and second input signals,
wherein the plurality of solid state amplifiers for each of the plurality of amplifier lines include four solid state amplifiers connected in series.

13. The solid state power amplifier device according to claim 12, wherein two of the four solid state amplifiers are MMIC amplifiers, one of the four solid state amplifiers is a HFET driver amplifier, and one of the four solid state amplifiers is a MMIC power amplifier.

14. A solid state power amplifier comprising:
at least one solid state amplifier for receiving an input signal; and
a power amplifier stage for receiving an output signal from the at least one solid state amplifier and for providing an amplified output signal, wherein the power amplifier stage comprises:
a divider for dividing the output signal into a plurality of signals;
a plurality of solid state amplifiers connected to the divider for receiving a respective one of the plurality of signals outputted by the divider and outputting a corresponding amplified signal;
a combiner connected to each of the plurality of solid state amplifiers for receiving the amplified signals and outputting the amplified output signal; and
an isolator connected to the combiner for receiving the amplified output signal.

15. The solid state power amplifier according to claim 14, wherein each of the plurality of solid state amplifiers of the power amplifier stage are Monolithic Microwave Integrated Circuit (MIMIC) amplifiers.

16. The solid state power amplifier according to claim 14, wherein the output power of the solid state power amplifier is approximately 11 Watts.

17. The solid state power amplifier according to claim 14, wherein the plurality of solid state amplifiers and the at least one solid state amplifier are procured in die form and installed in hybrid microcircuits.

18. The solid state power amplifier according to claim 14, wherein each of the plurality of solid state amplifiers and each of the at least one solid state amplifier is packaged in a hermetic package and each package contains at least one active device.

19. The solid state power amplifier according to claim 14, wherein the combiner contains branch-line couplers arranged asymmetrically.

20. A solid state power amplifier comprising:
at least one solid state amplifier for receiving an input signal; and
a power amplifier stage for receiving an output signal from the at least one solid state amplifier and for providing an amplified output signal, wherein the power amplifier state comprises:
a divider for dividing the output signal into a plurality of signals;
a plurality of solid state amplifiers connected to the divider for receiving a respective one of the plurality of signals outputted by the divider and outputting a corresponding amplified signal; and
a combiner connected to each of the plurality of solid state amplifiers for receiving the amplified signals and outputting the amplified output signal,
wherein the at least one solid state amplifier for receiving the input signal includes a Gallium Arsenide Monolithic Microwave Integrated Circuit (GaAs MMIC) amplifier and a Heterostructure Field Effect Transistor (HFET) driver amplifier, wherein the GaAs MMIC amplifier and the HFET amplifier are connected in series.

21. A solid state power amplifier comprising:
a solid state amplifier for receiving an input signal;
a divider for receiving an output signal from the solid state amplifier and dividing the output signal into a plurality of signals; and
a plurality of amplifier lines each having a plurality of solid state amplifiers and connected to a divider, wherein each one of the plurality of signals is fed to a respective one of the plurality of amplifier lines for providing output power from a respective output node of each of the plurality of amplifier lines,
wherein each of the plurality of amplifier lines includes an isolator connected in series to the plurality of solid state amplifiers.

22. The solid state power amplifier according to claim 21, wherein the plurality of solid state amplifiers for each of the plurality of amplifier lines include four solid state amplifiers connected in series.

23. The solid state power amplifier according to claim 21, wherein the output power of each of the plurality of amplifier lines is approximately 2.75 Watts.

24. The solid state power amplifier according to claim 21, wherein the plurality of solid state amplifiers of the plurality of amplifier lines are procured in die form and installed in hybrid microcircuits.

25. The solid state power amplifier according to claim 21, wherein each of the plurality of solid state amplifiers of the plurality of amplifier lines is packaged in a hermetic package and each package contains at least one active device.

26. A solid state power amplifier comprising:
a solid state amplifier for receiving an input signal;
a divider for receiving an output signal from the solid state amplifier and dividing the output signal into a plurality of signals; and
a plurality of amplifier lines each having a plurality of solid state amplifiers and connected to a divider, wherein each one of the plurality of signals is fed to a respective one of the plurality of amplifier lines for providing output power from a respective output node of each of the plurality of amplifier lines,
wherein each of the plurality of power amplifier lines includes a phase shifter for receiving a respective signal of the plurality of signals.

27. The solid state power amplifier according to claim 26, wherein each output node of the solid state power amplifier is configured for connection to a respective input node of a phased-array antenna.

28. A solid state power amplifier comprising:
   a solid state amplifier for receiving an input signal;
   a divider for receiving an output signal from the solid state amplifier and dividing the output signal into a plurality of signals; and
   a plurality of amplifier lines each having a plurality of solid state amplifiers and connected to a divider, wherein each one of the plurality of signals is fed to a respective one of the plurality of amplifier lines for providing output power from a respective output node of each of the plurality of amplifier lines,
   wherein the plurality of solid state amplifiers for each of the plurality of amplifier lines include four solid state amplifiers connected in series, and
   wherein two of the four solid state amplifiers are MMIC amplifiers, one of the four solid state amplifiers is a HFET driver amplifier, and one of the four solid state amplifiers is a MMIC power amplifier.

* * * * *

UNITED STATES PATENT AND TRADEMARK OFFICE
CERTIFICATE OF CORRECTION

PATENT NO. : 6,909,324 B2
DATED : June 21, 2005
INVENTOR(S) : Robert E. Wallis and Sheng Cheng It is certified that error appears in the above-identified patent and that said Letters Patent is hereby corrected as shown below:

Column 7,
Line 61, delete "MIMIC" and insert therefor -- MMIC --.

Column 8,
Line 51, delete "state" and insert therefor -- stage --.

Column 9,
Line 52, delete "MIMIC" and insert therefor -- MMIC --.

Signed and Sealed this

Twenty-seventh Day of September, 2005

JON W. DUDAS
*Director of the United States Patent and Trademark Office*